(12) United States Patent
Kong et al.

(10) Patent No.: US 6,696,897 B1
(45) Date of Patent: Feb. 24, 2004

(54) SYSTEM AND METHOD FOR VOLTAGE CONTROLLED OSCILLATOR PHASE INTERPOLATION

(75) Inventors: Shyang Kye Kong, San Diego, CA (US); Hongming An, San Diego, CA (US); Bruce Harrison Coy, San Diego, CA (US)

(73) Assignee: Applied MicroCircuits Corp., San Diego, CA (US)

( * ) Notice: Subject to any disclaimer, the term of this patent is extended or adjusted under 35 U.S.C. 154(b) by 0 days.

(21) Appl. No.: 10/218,946

(22) Filed: Aug. 14, 2002

(51) Int. Cl.$^7$ ............................................... H03B 27/00
(52) U.S. Cl. ..................... 331/45; 331/48; 327/158; 327/270; 327/274; 327/280
(58) Field of Search ................. 331/45, 47, 48, 331/49; 327/155–158, 161, 261, 266, 270, 271, 274, 276, 277, 280, 281

(56) References Cited

U.S. PATENT DOCUMENTS

| 5,144,174 A | * | 9/1992 | Murakami ................... 327/277 |
| 5,790,611 A | * | 8/1998 | Huang et al. ................ 375/371 |
| 6,100,735 A | * | 8/2000 | Lu ............................... 327/158 |
| 6,182,236 B1 | * | 1/2001 | Culley et al. ................ 713/503 |
| 6,194,928 B1 | * | 2/2001 | Heyne ......................... 327/152 |

* cited by examiner

*Primary Examiner*—Timothy P. Callahan
*Assistant Examiner*—An T. Luu
(74) *Attorney, Agent, or Firm*—Law Office of G. Maliszewski; Gerald Maliszewski

(57) ABSTRACT

A system and method are provided for controlling the phase of a voltage controlled oscillator output. The method comprises: accepting a plurality of VCO outputs coarsely differentiated by phase; selecting one of the VCO outputs; finely modifying the phase of the selected VCO output; and, supplying the phase modified VCO output. In one aspect, accepting VCO outputs coarsely differentiated by phase includes: accepting a first VCO output (I0); accepting a second VCO output (I1), differentiated approximately 90 degrees from the first VCO output; accepting a third VCO output (Q0), differentiated approximately 90 degrees from the second VCO output; and, accepting a fourth VCO output (Q1), differentiated approximately 90 degrees from the third VCO output. Finely modifying the phase of the selected VCO output includes modifying the selected VCO output in the range between +45 and −45 degrees. In one aspect, the output is modified in 16 discrete steps.

15 Claims, 5 Drawing Sheets

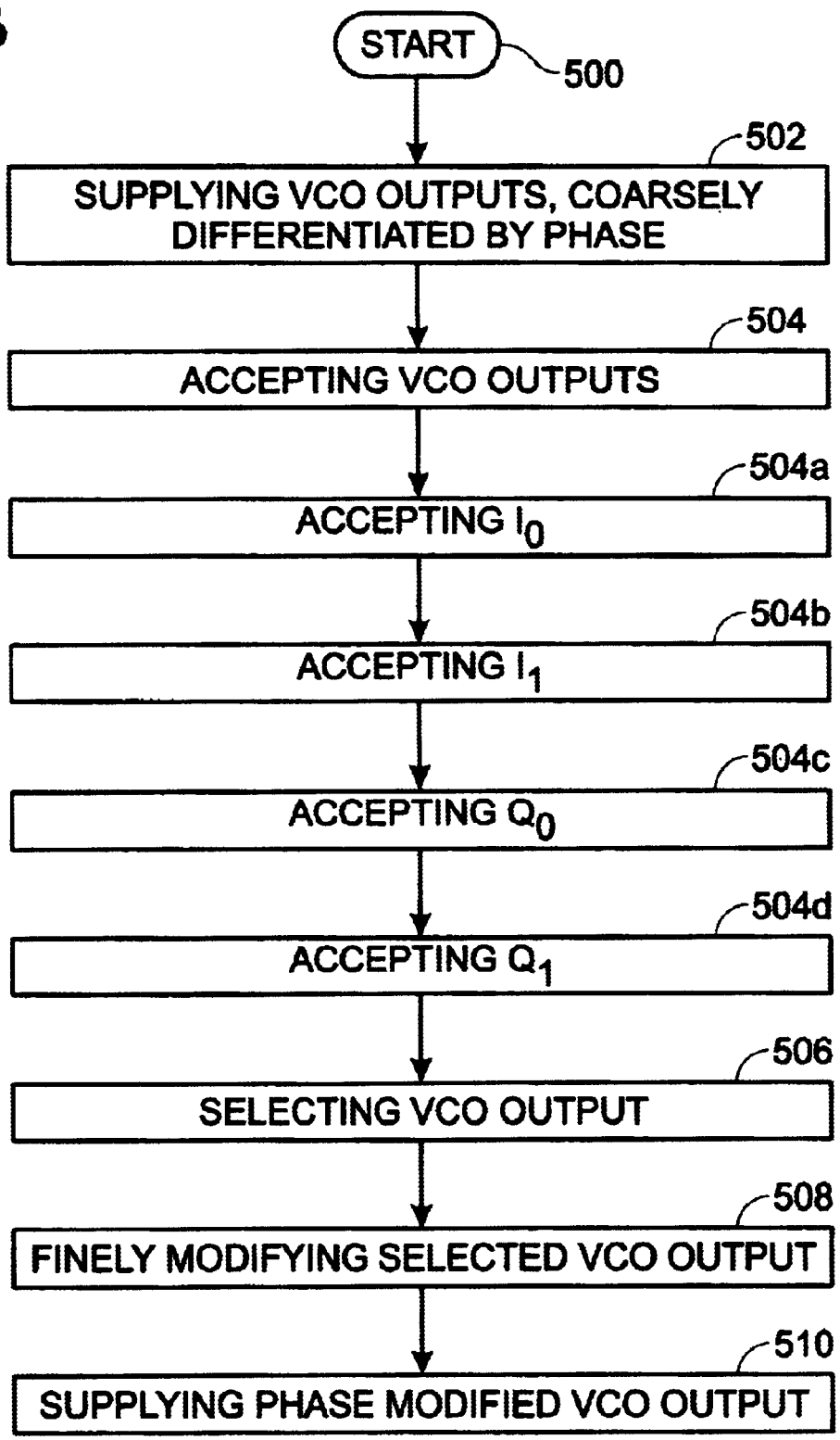

US 6,696,897 B1

SYSTEM AND METHOD FOR VOLTAGE CONTROLLED OSCILLATOR PHASE INTERPOLATION

BACKGROUND OF THE INVENTION

1. Field of the Invention

This invention generally relates to phase-locked loop timing and delay circuitry and, more particularly, to a system and method for providing a timing signal that can be selected from any phase of a voltage controlled oscillator (VCO) output signal.

2. Description of the Related Art

FIG. 1 is a schematic block diagram of a timing circuit using a VCO with a four-phase output (prior art). Conventionally, the four phase outputs are 90 degrees apart. In one aspect, the VCO supplies two differential phase outputs, 180 degrees. One of the phase outputs of the VCO can be used as a system clock or loop acquisition, for example. The phase outputs can also be used for other system timing events that are related to the system clock or VCO output signal. However, if the timing event does not occur at 0, 90, 180, or 270 degrees, with respect to the VCO signal, delay elements must be added to achieve the desired phase relationship. For example (as shown), the 90 degree phase output of the VCO may be directed though logic circuits, such as an inverting buffer. The propagation delay associated with logic circuits results in an additional phase shift, so that a resultant 100 degree phase output is created.

However, the propagation delay associated with logic circuits typically varies with respect to lot and temperature. Thus, the phase of the resultant output signal changes. Even if time invariant delays can be added to a system to generate phase shifts, such delays create a phase shift that is completely dependent upon the VCO frequency. If the VCO is operated at a different frequency, the phase shift associated with the time invariant delay necessarily changes, and the output signal phase shifts.

It would be advantageous if a VCO output signal could be used as a phase-selectable timing signal.

It would be advantageous if the phase of the above-mentioned timing signal could be adjusted to account for changes in the VCO frequency.

SUMMARY OF THE INVENTION

The present invention system and method provide a timing signal that is derived from a precisely selected phase of a VCO signal. A multiplexer initially selects one of the VCO outputs, which are differentiated by 90 degrees. Then, the phase of the selected signal is finely adjusted through the use of parallel differential amplifiers. As a result, a timing signal can be generated that varies from approximately zero degrees, to approximately 360 degrees of the VCO output signal.

Accordingly, a method is provided for controlling the phase of a voltage controlled oscillator output. The method comprises: accepting a plurality of VCO outputs coarsely differentiated by phase; selecting one of the plurality of VCO outputs; finely modifying the phase of the selected VCO output; and, supplying the phase modified VCO output.

As mentioned above, it is typical that each of the plurality of VCO outputs be differentiated by 90 degrees. That is, accepting a plurality of VCO outputs coarsely differentiated by phase includes: accepting a first VCO output (I0); accepting a second VCO output (I1), differentiated approximately 90 degrees from the first VCO output; accepting a third VCO output (Q0), differentiated approximately 90 degrees from the second VCO output; and, accepting a fourth VCO output (Q1), differentiated approximately 90 degrees from the third VCO output.

Finely modifying the phase of the selected VCO output includes modifying the selected VCO output in the range between +45 and −45 degrees. In one aspect, the output is modified in 16 discrete steps.

Additional details of the above-described method, and a system for controlling the phase of a VCO output are provided below.

BRIEF DESCRIPTION OF THE DRAWINGS

FIG. 5 is a flowchart illustrating the present invention method for controlling the phase of a voltage controlled oscillator (VCO) output.

DETAILED DESCRIPTION OF THE PREFERRED EMBODIMENTS

Figure 1:
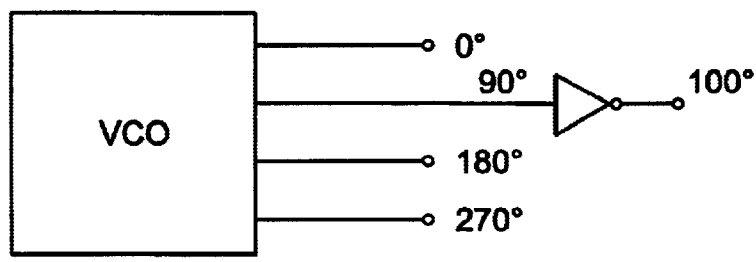
FIG. 1 is a schematic block diagram of a timing circuit using a VCO with a four-phase output (prior art).
Figure 2:
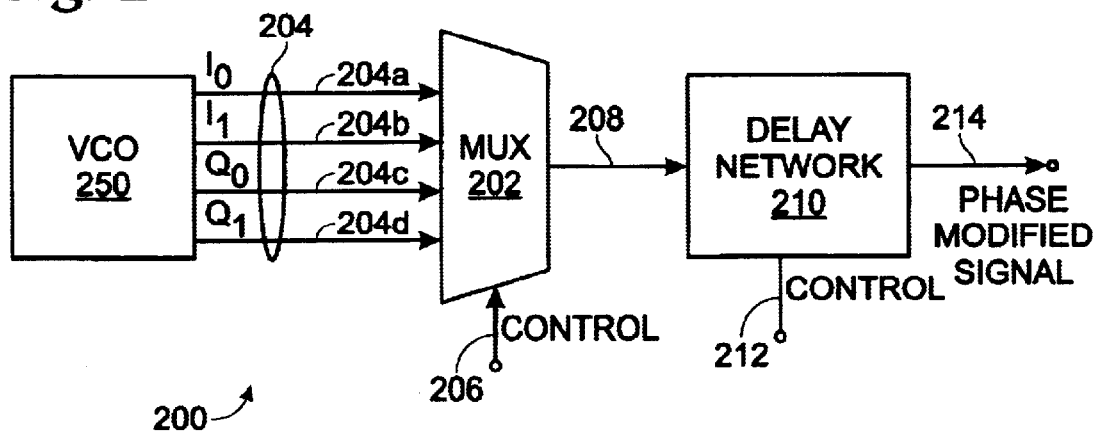
FIG. 2 is a schematic block diagram of the present invention system for controlling the phase of a voltage controlled oscillator (VCO) output.

FIG. 2 is a schematic block diagram of the present invention system for controlling the phase of a voltage controlled oscillator (VCO) output. The system 200 comprises a multiplexer (MUX) 202 having a plurality of inputs on line 204 to accept VCO outputs coarsely differentiated by phase. The MUX 202 has an input on line 206 to accept a control signal and an output on line 208 to supply the selected VCO output. A delay network 210 has an input on line 208 connected to the MUX output, a input on line 212 to accept a control signal, and an output on line 214 to supply a phase modified signal.

In some aspects of the system 200, the MUX 202 inputs accept VCO outputs differentiated by approximately (about) 90 degrees. That is, the MUX 202 includes an input on line 204a to accept a first VCO output (I0), and an input on line 204b to accept a second VCO output (I1), differentiated approximately 90 degrees from the first VCO output. The MUX 202 also has an input on line 204c to accept a third VCO output (Q0), differentiated approximately 90 degrees from the second VCO output, and an input on line 204d to accept a fourth VCO output (Q1), differentiated approximately 90 degrees from the third VCO output.

The delay network 210 modifies the selected VCO output on line 208 in the range between +45 and −45 degrees. Between the coarse and fine adjustments, the entire 360 degree phase range of the VCO signal can be selected. In some aspects, the delay network 210 modifies the selected VCO output in discrete steps between +45 and −45 degrees. In other aspects, the selected VCO output is modified in 16 discrete steps between +45 and −45 degrees.

The system 200 is depicted as having single-ended input and output signals, where a single-ended signal is a signal measured with respect to a reference voltage, such as ground. However, other aspects of the system use differential signals, where differential signals are 180 degree phase shifted signals measured with respect to each other. Then, the MUX 202 accepts differential VCO output signals on line 204, and the delay network 210 includes a plurality of differential amplifiers responsive to a plurality of control signals on line 212.

Figure 3A:
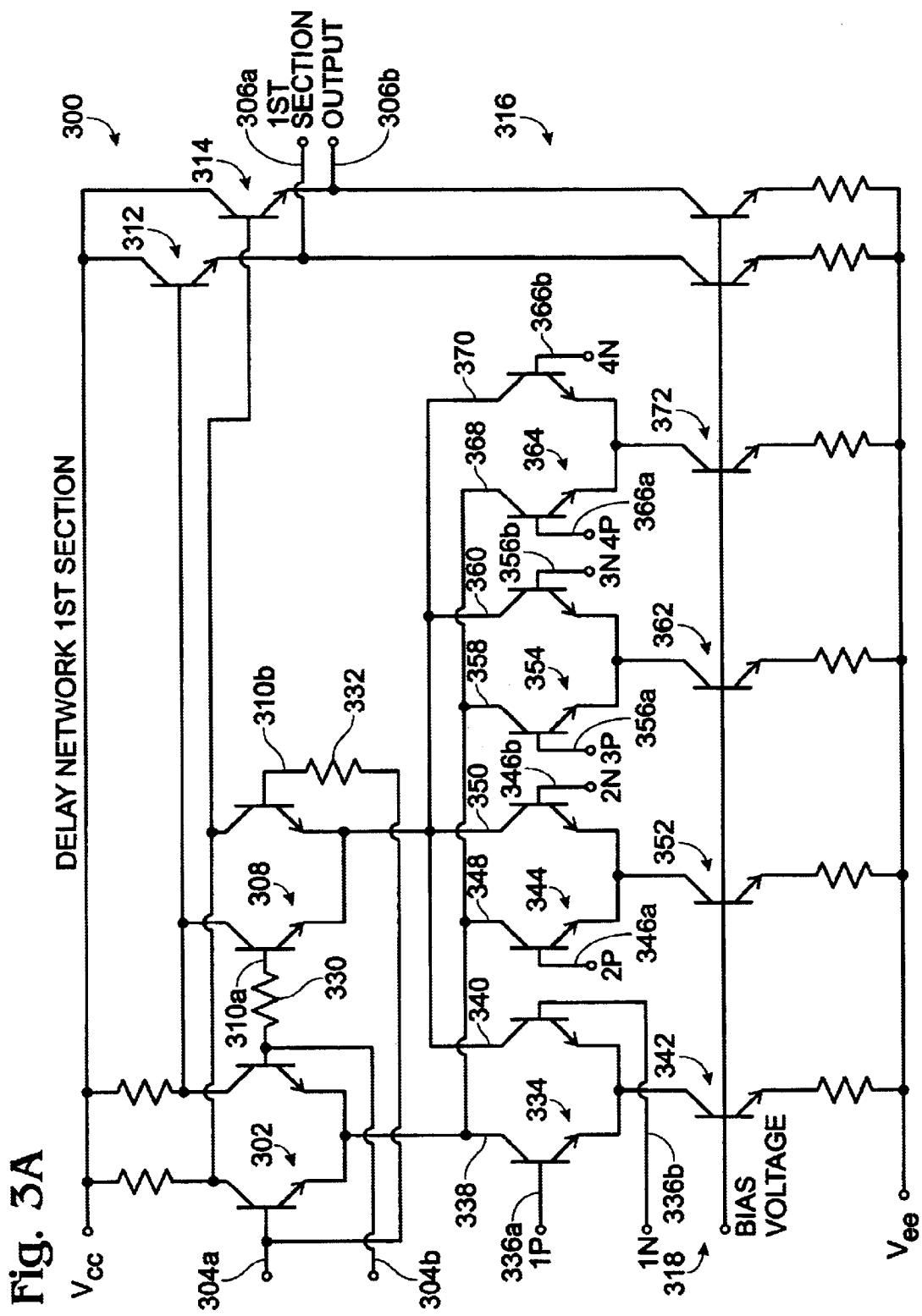
FIGS. 3a and 3b are schematic diagrams illustrating the delay network of FIG. 2 in greater detail.
Figure 3B:
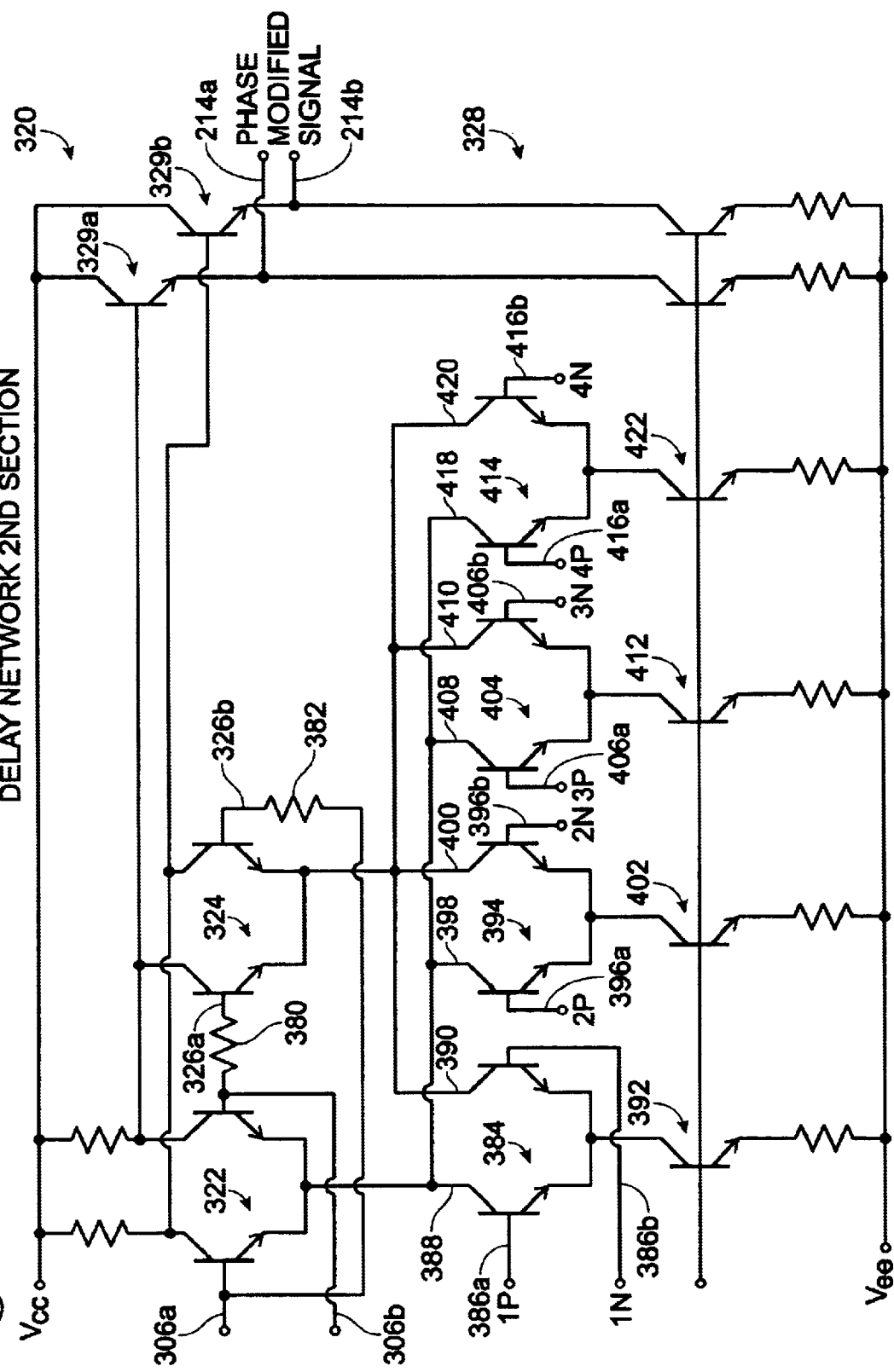

FIGS. 3a and 3b are schematic diagrams illustrating the delay network of FIG. 2 in greater detail. As seen in FIG. 3a, the delay network 210 has a first section 300 including a first fast differential amplifier 302 having an input, or differential input on lines 304a and 304b, connected to the MUX output. The first fast differential amplifier 302 has an output, or differential output on lines 306a and 306b to supply a first section output. A first slow differential amplifier 308 has an input, or differential input on lines 310a and 310b, connected or operatively (indirectly) connected to the MUX output. The first slow differential amplifier has an output, or differential output on lines 306a and 306b to supply the first section output. In some aspects of the invention, emitter-follower transistors 312 and 314 are included.

A first plurality of emitter-coupled amplifiers 316 are connected to differentially enable the first fast and slow differential amplifiers 302/308 in response to a corresponding first plurality of control signals. In some aspects, each of the first plurality of emitter-coupled amplifiers 316 conducts a different current. Typically, the first section 300 also includes a first plurality of current sources 318, where each current source sinks current for a corresponding emitter-coupler amplifier. In other aspects, the emitter-follower transistors 312 and 314 also have current sources. The current sources are shown including a transistor and a resistor, however, in other aspects only a transistor is used. In yet other aspects, the current source is merely a resistor.

Each of the first plurality of current sources 318, and its corresponding emitter-coupled amplifier, sinks a different current, when enabled by a control signal. The delay through the parallel fast and slow differential amplifiers is related to the conducted current. Therefore, since each emitter-couple amplifier conducts a different current, each emitter-coupled amplifier is responsible for delaying the amplified signal a different amount of time (phase).

FIG. 3b depicts the delay network second section 320. The second section 320 includes a second fast differential amplifier 322 having an input connected to the first section output on lines 306a and 306b, and an output to supply the phase modified output on lines 214a and 214b. A second slow differential amplifier 324 has an input on lines 326a and 326b connected, or operatively connected to the first section output, and an output on lines 214a and 214b to supply the phase modified signal. A second plurality of emitter-coupled amplifiers 328 are connected to differentially enable the fast and slow differential amplifiers 322/324 in response to a corresponding second plurality of control signals. In some aspects, the phase modified signal is conditioned by emitter-follower amplifiers 329a and 329b.

Returning to FIG. 3a, the first section 300 includes a first pair of resistors, 330 and 332, interposed between the first slow differential amplifier 308 and the MUX output on lines 304a and 304b.

A first emitter-coupled amplifier 334 has a differential input on lines 336a and 336b to accept a first differential control signal 1P and 1N, respectively. A first collector 338 is connected to the emitters of the first fast differential amplifier 302 and a second collector 340 is connected to the emitters of the first slow differential amplifier 308. The emitters of the first emitter-coupled amplifier 334 are connected to a first current source 342 to sink a first current in response to the first differential control signal.

A second emitter-coupled amplifier 344 has a differential input on lines 346a and 346b to accept a second differential control signal 2P and 2N, respectively. A first collector 348 is connected to the emitters of the first fast differential amplifier 302 and a second collector 350 is connected to the emitters of the first slow differential amplifier 308. The emitters of the second emitter-coupled amplifier 344 are connected to a second current source 352 to sink a second current in response to the second differential control signal.

A third emitter-coupled amplifier 354 has a differential input on lines 356a and 356b to accept a third differential control signal 3P and 3N, respectively. A first collector 358 is connected to the emitters of the first fast differential amplifier 302 and a second collector 360 is connected to the emitters of the first slow differential amplifier 308. The emitters of the third emitter-coupled amplifier 354 are connected to a third current source 362 to sink a third current in response to the third differential control signal.

A fourth emitter-coupled amplifier 364 has a differential input on lines 366a and 366b to accept a fourth differential control signal 4P and 4N, respectively. A first collector 368 is connected to the emitters of the first fast differential amplifier 302 and a second collector 370 is connected to the emitters of the first slow differential amplifier 308. The emitters of the fourth emitter-coupled amplifier 364 are connected to a fourth current source 372 to sink a fourth current in response to the fourth differential control signal.

Returning to FIG. 3b, the second section 320 includes a second pair of resistors, 380 and 382, interposed between the second slow differential amplifier 324 and the first section output on lines 306a and 306b.

A fifth emitter-coupled amplifier 384 has a differential input on lines 386a and 386b to accept the first differential control signal 1P and 1N, respectively. A first collector 388 is connected to the emitters of the second fast differential amplifier 322 and a second collector 390 is connected to the emitters of the second slow differential amplifier 324. The emitters of the fifth emitter-coupled amplifier 384 are connected to a fifth current source 392 to sink the first current in response to the first differential control signal.

A sixth emitter-coupled amplifier 394 has a differential input on lines 396a and 396b to accept the second differential control signal 2P and 2N, respectively. A first collector 398 is connected to the emitters of the second fast differential amplifier 322 and a second collector 400 is connected to the emitters of the second slow differential amplifier 324. The emitters of the sixth emitter-coupled amplifier 394 are connected to a sixth current source 402 to sink the second current in response to the second differential control signal.

A seventh emitter-coupled amplifier 404 has a differential input on lines 406a and 406b to accept the third differential control signal 3P and 3N, respectively. A first collector 408 is connected to the emitters of the second fast differential amplifier 322 and a second collector 390 is connected to the emitters of the second slow differential amplifier 324. The emitters of the seventh emitter-coupled amplifier 404 are connected to a seventh current source 412 to sink the third current in response to the third differential control signal.

An eighth emitter-coupled amplifier 414 has a differential input on lines 416a and 416b to accept the fourth differential control signal 4P and 4N, respectively. A first collector 418 is connected to the emitters of the second fast differential amplifier 322 and a second collector 420 is connected to the emitters of the second slow differential amplifier 324. The emitters of the eighth emitter-coupled amplifier 414 are connected to an eighth current source 422 to sink the fourth current in response to the fourth differential control signal.

As shown, the delay network can be set to a plurality of different delay states in response to the four control lines. If the control lines supply a digital (on/off) signal, the four bits of differential logic can be used to create 16 ($2^4$) different delay states. If the control lines supply an analog signal, then even greater control can be obtained in the delay variations. In other aspects of the system where each emitter-coupled amplifier has a dedicated control line, then 28 steps of delay variation can be generated with eight digital control signals. Other variations of the system include different numbers of emitter-coupled amplifiers per delay network section, or a different number of sections per delay network. The present invention system is not limited to any particular number of control lines, types of control line signals, emitter-coupled amplifiers per section, or sections per delay network.

Figure 4:
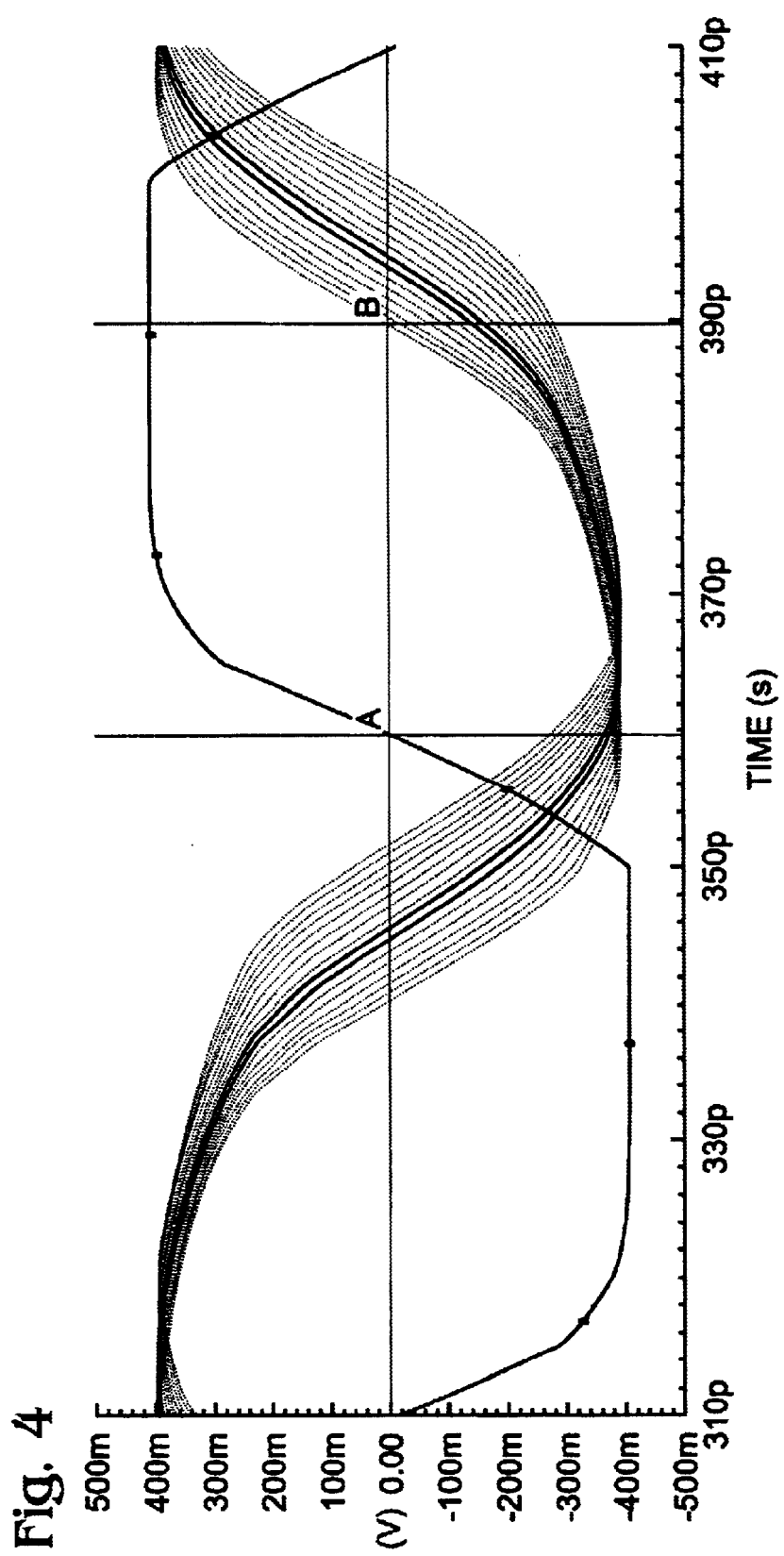
FIG. 4 is a timing diagram illustrating the 16 steps of discrete phase delay that can be engaged using the present invention delay network.

FIG. 4 is a timing diagram illustrating the 16 steps of discrete phase delay that can be engaged using the present invention delay network. As shown, the 16 steps are able to create a phase variation of approximately 90 degrees (±45 degrees) about a (coarsely) selected VCO output signal.

Returning to FIG. 2, some aspects of the system 200 further comprise a VCO 250 including an output on line 204a connected to the MUX to supply the first VCO output, and an output on line 204b connected to the MUX to supply the second VCO output. The VCO has an output on line 204c connected to the MUX to supply the third VCO output, and an output on line 204d connected to the MUX to supply the fourth VCO output. Although the system 200 is described as having 90 degrees differentiation in coarse phase adjustment, the invention is not necessarily so limited. Other aspects of the system (not shown) use greater or less degrees of coarse phase differentiation in signals supplied by the VCO.

FIG. 5 is a flowchart illustrating the present invention method for controlling the phase of a voltage controlled oscillator (VCO) output. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 500.

Step 502 supplies a plurality of VCO outputs coarsely differentiated by phase. Step 504 accepts the plurality of VCO outputs coarsely differentiated by phase. Step 506 selects one of the plurality of VCO outputs. Step 508 finely modifies the phase of the selected VCO output. Step 510 supplies the phase modified VCO output.

In some aspects of the method, accepting a plurality of VCO outputs coarsely differentiated by phase in Step 504 includes accepting VCO outputs differentiated by approximately 90 degrees. In other aspects, accepting a plurality of VCO outputs coarsely differentiated by phase includes sub-steps. Step 504a accepts a first VCO output (I0). Step 504b accepts a second VCO output (I1), differentiated approximately 90 degrees from the first VCO output. Step 504c accepts a third VCO output (Q0), differentiated approximately 90 degrees from the second VCO output. Step 504d accepts a fourth VCO output (Q1), differentiated approximately 90 degrees from the third VCO output.

In some aspects, finely modifying the phase of the selected VCO output in Step 508 includes modifying the selected VCO output in the range between +45 and −45 degrees. In other aspects, Step 508 modifies the selected VCO output in discrete steps between +45 and −45 degrees. In one aspect, the selected VCO output is modified in 16 discrete steps between +45 and −45 degrees.

A system and method have been provided for controlling the phase of a VCO output, for use as a timing signal. An example of a particular circuit implementation has been given to clearly illustrate and recite the fundamental concepts. However, the present invention is not limited to merely this example. Other variations and embodiments of the invention will occur to those skilled in the art.

We claim:

1. A method for controlling the phase of a voltage controlled oscillator (VCO) output, the method comprising:
   accenting a first VCO output (I0);
   accenting a second VCO output (I1), differentiated approximately 90 decrees from the first VCO output;
   accepting a third VCO output (Q0), differentiated approximately 90 degrees from the second VCO output;
   accepting a fourth VCO output (Q1), differentiated approximately 90 degrees from the third VCO output;
   selecting one of the plurality of VCO outputs;
   finely modifying the phase of the selected VCO output in the range between +45 and −45 degrees by:
   amplifying the selected VCO output in parallel, generating amplified signals differentiated by phase; and,
   differentially enabling the amplified signals; and,
   supplying the phase modified VCO output.

2. The method of claim 1 wherein modifying the selected VCO output in the range between +45 and −45 degrees includes modifying the selected VCO output in discrete steps between +45 and −45 degrees.

3. The method of claim 2 wherein the selected VCO output is modified in 16 discrete steps between +45 and −45 degrees.

4. A system for controlling the phase of a voltage controlled oscillator (VCO) output, the system comprising:
   a multiplexer having a plurality of inputs to accept VCO outputs coarsely differentiated by phase, an input to accept a first control signal and an output to supply a selected VCO output; and,
   a delay network having an input connected to the MUX output, a input to accept a second control signal, and an output to supply a phase modified signal, the delay network having a first section including:
   a first fast differential amplifier having an input connected to the MUX output and an output to supply a first section output;
   a first slow differential amplifier having an input connected to the MUX output and an output to supply the first section output; and,
   a first plurality of emitter-coupled amplifiers connected to differentially enable the first fast and slow differential amplifiers in response to a corresponding first plurality of control signals.

5. The system of claim 4 wherein the MUX inputs accept VCO outputs differentiated by approximately 90 degrees.

6. The system of claim 5 wherein the MUX includes:
   a first input to accept a first VCO output (I0);
   a second input to accept a second VCO output (I1), differentiated approximately 90 degrees from the first VCO output;
   a third input to accept a third VCO output (Q0), differentiated approximately 90 degrees from the second VCO output; and, a fourth input to accept a fourth VCO output (Q1), differentiated approximately 90 degrees from the third VCO output.

7. The system of claim 6 wherein the delay network modifies the selected VCO output in the range between +45 and −45 degrees.

8. The system of claim 7 wherein the delay network modifies the selected VCO output in discrete steps between +45 and −45 degrees.

9. The system of claim 8 wherein the delay network modifies the selected VCO output in 16 discrete steps between +45 and −45 degrees.

10. The system of claim 4 wherein each of the first plurality of emitter-coupled amplifiers conducts a different current.

11. The system of claim 10 further comprising:
   a first plurality of current sources, each current source sinking current for a corresponding emitter-coupler amplifier.

12. The system of claim 10 wherein the delay network has a second section including:
   a second fast differential amplifier having an input connected to the first section output and an output to supply the phase modified signal;
   a second slow differential amplifier having an input connected to the first section output and an output to supply the phase modified signal; and,
   a second plurality of emitter-coupled amplifiers connected to differentially enable the fast and slow differential amplifiers in response to a corresponding second plurality of control signals.

13. The system of claim 12 wherein the delay network first section includes:
   the first fast differential amplifier having a differential input connected to the MUX output and an output to supply a differential first section output signal;
   the first slow differential amplifier having a differential input connected to the MUX output and an output to supply the differential first section output signal;
   a first pair of resistors interposed between the inputs of the first slow differential amplifier and the MUX outputs;
   a first emitter-coupled amplifier having a differential input to accept a first differential control signal, a first collector connected to the first fast differential amplifier emitters and a second collector connected to the first slow differential amplifier emitters, and emitters connected to a first current source to sink a first current in response to the first differential control signal;
   a second emitter-coupled amplifier having a differential input to accept a second differential control signal, a first collector connected to the first fast differential amplifier emitters and a second collector connected to the first slow differential amplifier emitters, and emitters connected to a second current source to sink a second current in response to the second differential control signal;
   a third emitter-coupled amplifier having a differential input to accept a third differential control signal, a first collector connected to the first fast differential amplifier emitters and a second collector connected to the first slow differential amplifier emitters, and emitters connected to a third current source to sink a third current in response to the third differential control signal; and,
   a fourth emitter-coupled amplifier having a differential input to accept a fourth differential control signal, a first collector connected to the first fast differential amplifier emitters and a second collector connected to the first slow differential amplifier emitters, and emitters connected to a fourth current source to sink a fourth current in response to the fourth differential control signal.

14. The system of claim 13 wherein the delay network second section includes:
   the second fast differential amplifier having a differential input connected to first section output and an output to supply a differential phase modified signal;
   the second slow differential amplifier having a differential input connected to the first section output and an output to supply the differential phase modified signal;
   a second pair of resistors interposed between the inputs of the second slow differential amplifier and the first section outputs;
   a fifth emitter-coupled amplifier having a differential input to accept the first differential control signal, a first collector connected to the second fast differential amplifier emitters and a second collector connected to the second slow differential amplifier emitters, and emitters connected to a fifth current source to sink the first current in response to the first differential control signal;
   a sixth emitter-coupled amplifier having a differential input to accept the second differential control signal, a first collector connected to the second fast differential amplifier emitters and a second collector connected to the second slow differential amplifier emitters, and emitters connected to a sixth current source to sink the second current in response to the second differential control signal;
   a seventh emitter-coupled amplifier having a differential input to accept the third differential control signal, a first collector connected to the second fast differential amplifier emitters and a second collector connected to the second slow differential amplifier emitters, and emitters connected to a seventh current source to sink the third current in response to the third differential control signal; and,
   an eighth emitter-coupled amplifier having a differential input to accept the fourth differential control signal, a first collector connected to the second fast differential amplifier emitters and a second collector connected to the second slow differential amplifier emitters, and emitters connected to an eighth current source to sink the fourth current in response to the fourth differential control signal.

15. The system of claim 6 further comprising:
   a VCO including:
      a first output connected to the MUX to supply the first VCO output;
      a second output connected to the MUX to supply the second VCO output;
      a third output connected to the MUX to supply the third VCO output; and,
      a fourth output connected to the MUX to supply the fourth VCO output.

* * * * *